(12) United States Patent
Liao et al.

(10) Patent No.: US 12,046,647 B2
(45) Date of Patent: Jul. 23, 2024

(54) SEMICONDUCTOR DEVICE AND FABRICATION METHOD THEREOF

(71) Applicant: INNOSCIENCE (ZHUHAI) TECHNOLOGY CO., LTD., Zhuhai (CN)

(72) Inventors: Hang Liao, Zhuhai (CN); Lijie Zhang, Zhuhai (CN); King Yuen Wong, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 255 days.

(21) Appl. No.: 16/763,559

(22) PCT Filed: Apr. 16, 2020

(86) PCT No.: PCT/CN2020/085142
§ 371 (c)(1),
(2) Date: May 13, 2020

(87) PCT Pub. No.: WO2021/208020
PCT Pub. Date: Oct. 21, 2021

(65) Prior Publication Data
US 2022/0109056 A1    Apr. 7, 2022

(51) Int. Cl.
*H01L 29/778*    (2006.01)
*H01L 21/285*    (2006.01)
(Continued)

(52) U.S. Cl.
CPC .. *H01L 29/42316* (2013.01); *H01L 21/28581* (2013.01); *H01L 21/28587* (2013.01);
(Continued)

(58) Field of Classification Search
CPC .................. H01L 29/7787; H01L 29/7786
See application file for complete search history.

(56) References Cited

U.S. PATENT DOCUMENTS 7,576,373 B1 *   8/2009   Hikita .............. H01L 29/66462
                                                    257/195
8,877,574 B1 *  11/2014   Basu ................... H01L 21/0272
                                                    438/312
(Continued)

FOREIGN PATENT DOCUMENTS

CN      103107198 A     5/2013
CN      105453216 A     3/2016
(Continued)

OTHER PUBLICATIONS

Li, L. "GaN HEMTs on Si With Regrown Contacts and Cutoff/Maximum Oscillation Frequencies of 250/204 Ghz" IEEE Elec. Dev. Lett. vol. 41, No. 5, Mar. 31, 2020 pp. 689-692 (Year: 2020).*
(Continued)

*Primary Examiner* — Grant S Withers
(74) *Attorney, Agent, or Firm* — McCoy Russell LLP

(57)    ABSTRACT

The present disclosure provides a semiconductor device and a fabrication method thereof. The semiconductor device includes a III-V material layer and a gate structure. The gate structure includes a first portion and a second portion on the first portion. The first portion is on the III-V material layer. The first portion has a first surface and a second surface opposite to the first surface and adjacent to the III-V material layer. A length of the second surface of the first portion of the gate structure is less than a length of the first surface of the first portion of the gate structure. A length of the second portion of the gate structure is less than the length of the first portion of the gate structure.

15 Claims, 9 Drawing Sheets

(51) Int. Cl.
*H01L 21/3213* (2006.01)
*H01L 29/20* (2006.01)
*H01L 29/205* (2006.01)
*H01L 29/423* (2006.01)
*H01L 29/66* (2006.01)

(52) U.S. Cl.
CPC .... *H01L 21/32136* (2013.01); *H01L 29/2003* (2013.01); *H01L 29/205* (2013.01); *H01L 29/66462* (2013.01); *H01L 29/7786* (2013.01); *H01L 29/7787* (2013.01)

(56) References Cited

U.S. PATENT DOCUMENTS

| | | | | |
|---|---|---|---|---|
| 9,368,622 B1* | 6/2016 | Boutros | ............ | H01L 29/42316 |
| 2008/0079023 A1* | 4/2008 | Hikita | ............... | H01L 29/66462 |
| | | | | 257/E29.252 |
| 2010/0330754 A1* | 12/2010 | Hebert | ............... | H01L 29/66462 |
| | | | | 257/E21.403 |
| 2011/0057272 A1* | 3/2011 | Kurahashi | ......... | H01L 29/66462 |
| | | | | 257/410 |
| 2020/0251563 A1* | 8/2020 | Jiang | .................... | H01L 29/402 |
| 2021/0005742 A1* | 1/2021 | Ujita | .................. | H01L 29/2003 |
| 2021/0083086 A1* | 3/2021 | Huang | ............. | H01L 21/28581 |

FOREIGN PATENT DOCUMENTS

| | | |
|---|---|---|
| CN | 107507856 A | 12/2017 |
| CN | 109817710 A | 5/2019 |
| CN | 110459610 A | 11/2019 |
| JP | 2008091394 A | 4/2008 |
| JP | 2008306083 A | 12/2008 |

OTHER PUBLICATIONS

International Search Report and Written Opinion of the corresponding PCT application No. PCT/CN2020/085142 mailed on Dec. 28, 2020.

State Intellectual Property Office of the People's Republic of China, Office Action and Search Report Issued in Application No. 202080001057.7, Mar. 1, 2023, 17 pages. (Submitted with Partial Translation).

* cited by examiner

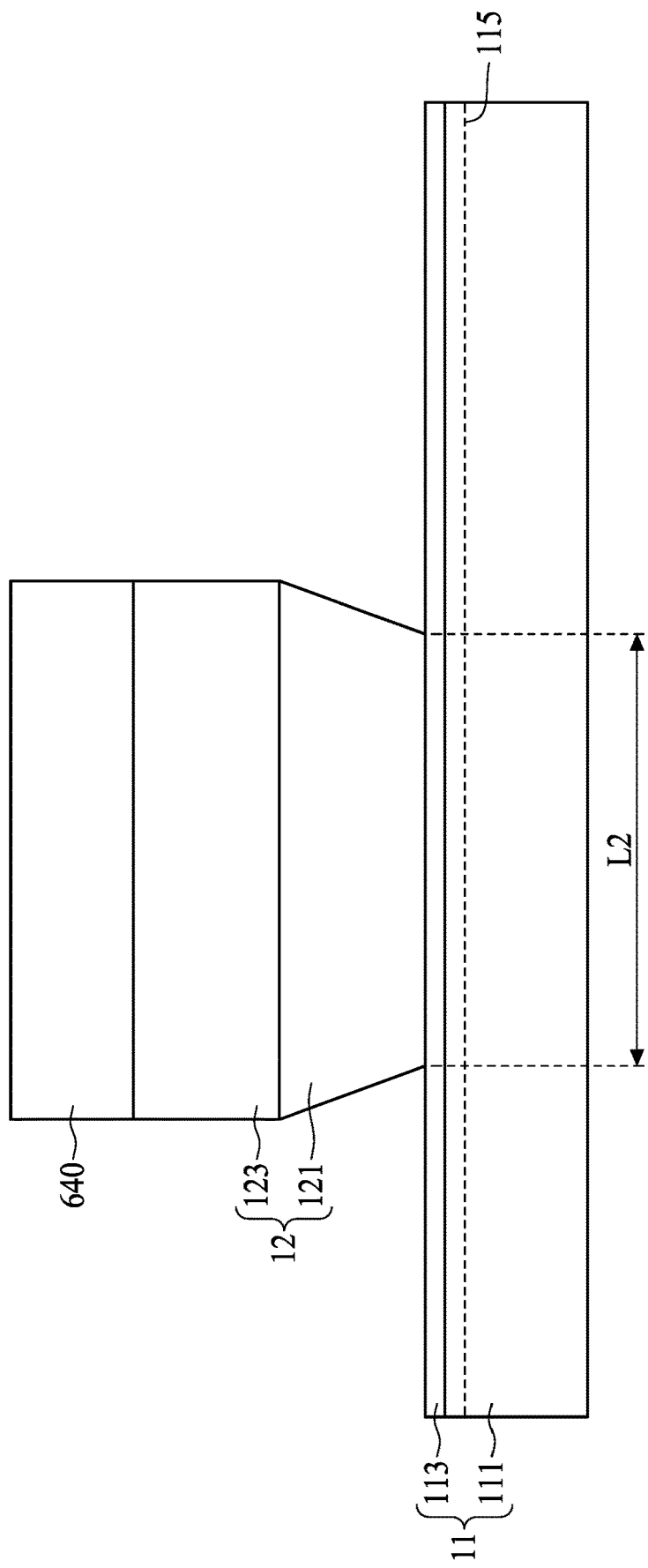

SEMICONDUCTOR DEVICE AND FABRICATION METHOD THEREOF

BACKGROUND

1. Technical Field

The present disclosure relates to a semiconductor device and a fabrication method thereof, and more particularly to a semiconductor device having a III-V material layer and a fabrication method thereof.

2. Description of the Related Art

Components including direct bandgap semiconductors, for example, semiconductor components including group III-V materials or group III-V compounds (Category: III-V compounds), can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET) and the like.

SUMMARY OF THE INVENTION

In some embodiments of the present disclosure, a semiconductor device is provided, which includes a III-V material layer and a gate structure. The gate structure includes a first portion and a second portion on the first portion. The first portion is on the III-V material layer. The first portion has a first surface and a second surface opposite to the first surface and adjacent to the III-V material layer. A length of the second surface of the first portion of the gate structure is less than a length of the first surface of the first portion of the gate structure. A length of the second portion of the gate structure is less than the length of the first portion of the gate structure.

In some embodiments of the present disclosure, a semiconductor device is provided, which includes a III-V material layer and a gate structure. The gate structure includes a first portion and a second portion on the first portion. The first portion is on the III-V material layer. The first portion has a first surface and a second surface opposite to the first surface and adjacent to the III-V material layer. A ratio of a length of the first surface of the first portion of the gate structure to a length of the second surface of the first portion of the gate structure ranges from about greater than 1 to about 1.6.

In some embodiments of the present disclosure, a method for manufacturing a semiconductor device is provided. The method includes forming a III-V material layer and forming a layer of first material on the III-V material layer. The method for manufacturing a semiconductor device further includes forming a layer of second material on the layer of first material and removing a part of the layer of first material to taper the layer of first material toward the III-V material layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIGS. 6A, 6B and 6C illustrate several operations in manufacturing a semiconductor device according to some embodiments of the present disclosure;

PREFERRED EMBODIMENT OF THE PRESENT INVENTION

Figure 1:
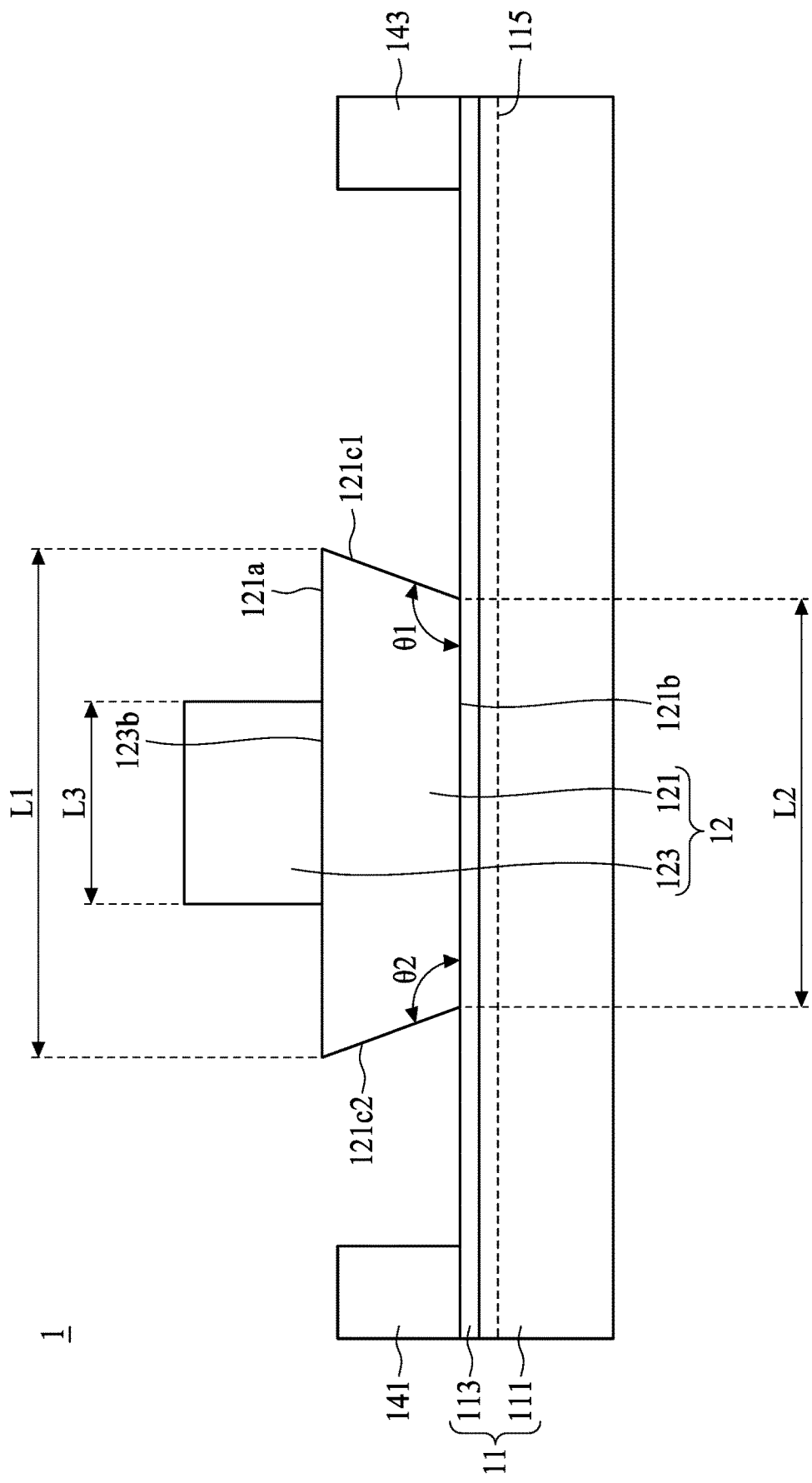
FIG. 1 is a cross-sectional view of a semiconductor device according to some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor device 1 according to some embodiments of the present disclosure. As shown in FIG. 1, the semiconductor device 1 includes a III-V material layer 11 and a gate structure 12.

The III-V material layer 11 may include a III-nitride layer 111 and a III-nitride layer 113 on the III-nitride layer 111. In some embodiments, the III-nitride layer 111 may be disposed on a substrate (not shown in FIG. 1). The substrate may include, without limitation, silicon (Si), doped Si, silicon carbide (SiC), germanium silicide (SiGe), gallium arsenide (GaAs), or other semiconductor materials. The substrate may include, without limitation, sapphire, silicon on insulator (SOI), or other suitable materials. In some embodiments, the substrate may further include a doped region, for example, a p-well, an n-well, or the like.

The III-nitride layer 111 may include, without limitation, a group III nitride, for example, a compound $In_xAl_yGa_{1-x-y}N$, in which x+y≤1. The group III nitride may further include, but is not limited to, for example, a compound $Al_yGa_{(1-y)}N$, in which y≤1. For example, the III-nitride layer 111 may include a GaN layer having a bandgap of about 3.4 V.

The III-nitride layer 113 may be in direct contact with the III-nitride layer 111. The III-nitride layer 113 may include, without limitation, a group III nitride, for example, a compound $In_xAl_yGa_{1-x-y}N$, in which x+y≤1. The group III nitride may further include, but is not limited to, for example, a compound $Al_yGa_{(1-y)}N$, in which y≤1. For example, the III-nitride layer 113 may include AlGaN having a band gap of about 4.

A heterojunction is formed between the III-nitride layer 111 and the III-nitride layer 113, e.g., at an interface of the III-nitride layer 111 and the III-nitride layer 113, and the polarization of the heterojunction of different nitrides forms a two-dimensional electron gas (2DEG) region 115 adjacent to the interface of the III-nitride layer 111 and the III-nitride layer 113. In some embodiments, the 2DEG region 115 is formed in the III-nitride layer 111. The III-nitride layer 111 can provide electrons to or remove electrons from the 2DEG region 115, thereby controlling the conduction of the semiconductor device 1.

The gate structure 12 may include a portion 121 and a portion 123 on the portion 121. The portion 121 may be on the III-V material layer 110. In some embodiments, the portion 121 of the gate structure 12 has a surface 121a (also referred to as "an upper surface"), and the portion 121 further has a surface 121b (also referred to as "a bottom surface") opposite to the surface 121a and adjacent to the III-V material layer 11.

In some embodiments, the portion 121 of the gate structure 12 tapers from a cross-sectional view perspective having a cross-sectional shape of approximately an inverted trapezoid having a longer upper surface 121a and a shorter lower surface 121b as seen in FIG. 1. In some embodiments, the portion 121 of the gate structure 12 tapers toward the III-V material layer 11. In some embodiments, the portion 121 of the gate structure 12 has a surface 121c1 (also referred to as "a lateral surface") extending between the surface 121a and the surface 121b, and an angle θ1 defined by the surface 121c1 with respect to the surface 121b is ranged from about 95° to about 145°. In some embodiments, the angle θ1 defined by the surface 121c1 with respect to the surface 121b is ranged from about 110° to about 130°.

In some embodiments, the portion 121 of the gate structure 12 further has a surface 121c2 (also referred to as "a lateral surface") extending between the surface 121a and the surface 121b, and the surface 121c2 is opposite to the surface 121c1. In some embodiments, an angle θ2 defined by the surface 121c2 with respect to the surface 121b is ranged from about 95° to about 145°. In some embodiments, the angle θ2 defined by the surface 121c1 with respect to the surface 121b is ranged from about 110° to about 130°. In some embodiments, the angle θ1 may be the same as or different from the angle θ2.

In some embodiments, a length L2 of the surface 121b (also referred to as "the bottom surface") of the portion 121 of the gate structure 12 is less than a length L1 of the surface 121a (also referred to as "the upper surface") of the portion 121 of the gate structure 12. In some embodiments, a ratio of the length L1 of the surface 121a of the portion 121 of the gate structure 12 to the length L2 of the surface 121b of the portion 121 of the gate structure 12 ranges from about 1 to about 1.6. In some embodiments, the ratio of the length L1 of the surface 121a of the portion 121 of the gate structure 12 to the length L2 of the surface 121b of the portion 121 of the gate structure 12 may further range from about 1.1 to about 1.4.

In some embodiments, the surface 121a (also referred to as "the upper surface") of the portion 121 of the gate structure 12 is substantially planar. In some embodiments, the III-V material layer 11 is in direct contact with the surface 121b (also referred to as "the bottom surface") of the portion 121 of the gate structure 12. In some embodiments, an average surface roughness of the surface 121c1 (also referred to as "the lateral surface") is less than about 0.2 µm. In some embodiments, an average surface roughness of the surface 121c2 (also referred to as "the lateral surface") is less than about 0.2 µm.

In some embodiments, the portion 121 of the gate structure 12 may be or include a group III-V layer. In some embodiments, the portion 121 of the gate structure 12 may be or include an epitaxial p-type III-V material. The portion 121 of the gate structure 12 may include, for example, but is not limited to, group III nitride, for example, a compound $Al_yGa_{(1-y)}N$, in which y≤1. In some embodiments, a material of the portion 121 of the gate structure 12 may include a p-type doped group III-V layer. In some embodiments, a material of the portion 121 of the gate structure 12 may include p-type doped GaN.

The portion 123 of the gate structure 12 may be on the portion 121 of the gate structure 12. In some embodiments, the portion 123 of the gate structure 12 is in direct contact with the portion 121 of the gate structure 12. In some embodiments, the portion 123 of the gate structure 12 is in direct contact with the surface 121a (also referred to as "the upper surface") of the portion 121 of the gate structure 12. In some embodiments, a surface 123b (also referred to as "a bottom surface") of the portion 123 of the gate structure 12 is in direct contact with the surface 121a of the portion 121 of the gate structure 12. In some embodiments, a length L3 of the portion 123 of the gate structure 12 is less than the length L1 of the portion 121 of the gate structure 12. In some embodiments, the length L3 refers to a length of the surface 123b of the portion 123 of the gate structure 12.

In some embodiments, a ratio of the length L1 of the surface 121a (also referred to as "the upper surface") of the portion 121 of the gate structure 12 to the length L3 of a surface 123b (also referred to as "the bottom surface") of the portion 123 of the gate structure 12 ranges from about 1.4 to about 2.4. In some embodiments, the ratio of the length L1 to the length L3 may further range from about 1.6 to about 2.2.

In some embodiments, the portion 123 of the gate structure 12 may be or include a gate metal. In some embodiments, the gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

In some embodiments, the 2DEG region 115 is formed under the portion 121 of the gate structure 12 and is preset to be in an OFF state when the gate structure 12 is in a zero-bias state. When a voltage is applied to the gate structure 12, electrons or charges are induced in the region below the gate structure 12. When the voltage increases, the number of induced electrons or charges increases as well. Such a device can be referred to as an enhancement-mode device.

In some cases, a gate structure includes a semiconductor gate and a metal gate on an upper surface of the semiconductor gate, a bottom surface of the semiconductor gate is adjacent to a channel region, and the channel region is defined by the length of the bottom surface of the semiconductor gate. When the length of the bottom surface of the semiconductor gate is greater than the upper surface of the semiconductor gate, edge portions of the bottom surface of the semiconductor gate exceed the outer edges of the upper surface of the semiconductor gate and are relatively far from the metal gate from a top view perspective. As such, portions of the channel region corresponding to the edge portions of the bottom surface of the semiconductor gate have relatively high conduction resistance, and the metal gate has a relatively poor control ability over these portions of the channel region having relatively high conduction resistance.

According to some embodiments of the present disclosure, the length L2 of the bottom surface (i.e., the surface 121b) of the portion 121 of the gate structure 12 is less than the length L1 of the upper surface (i.e., the surface 121a) of the portion 121 of the gate structure 12, and thus the whole channel region under the bottom surface (i.e., the surface 121b) is relatively close to the portion 123 of the gate structure 12 from a top view perspective. Therefore, the whole channel region can have a relatively low conduction resistance, the portion 123 of the gate structure 12 has a relatively good control ability over the channel region, and thus the electrical performance of the semiconductor device 1 is improved.

In addition, when the ratio of the length L1 to the length L2 is within a critical range from greater than 1 to about 1.6 or from about 1.1 to about 1.4, the channel region can be further provided with sufficient length without adversely affecting the electrical performance of the semiconductor device 1.

Moreover, according to some embodiments of the present disclosure, the lateral surface (i.e., the surface 121c1 and/or 121c2) and the bottom surface (i.e., the surface 121b) of the portion 121 of the gate structure 12 form the angle θ1 and/or the angle θ2 that is within a critical range from about 95° to about 145° or from about 110° to about 130°, such that the length (i.e., the length L2) of the bottom surface (i.e., the surface 121b) of the portion 121 that contacts the III-V material layer 11 is shorter than the length (i.e., the length L1) of the upper surface (i.e., the surface 121a) of the portion 121 that contacts the portion 123. Therefore, the whole channel region under the bottom surface (i.e., the surface 121b) can have a relatively low conduction resistance, the portion 123 of the gate structure 12 has a relatively good control ability over the channel region, and thus the electrical performance of the semiconductor device 1 is improved.

In some embodiments, the semiconductor device 1 may further include a conductive layer 141 and a conductive layer 143. The conductive layer 141 and the conductive layer 143 are disposed over the III-nitride layer 113, and the gate structure 12 is disposed between the conductive layer 141 and the conductive layer 143. In some embodiments, one of the conductive layer 141 and the conductive layer 143 can serve as a drain contact, and the other one of the conductive layer 141 and the conductive layer 143 can serve as a source contact. In some embodiments, the conductive layer 141 and the conductive layer 143 may independently include, for example, without limitation, a conductor material. The conductor materials may include, but are not limited to, for example, metals, alloys, doped semiconductor materials (e.g., doped crystalline silicon), or other suitable conductor materials.

Figure 2:
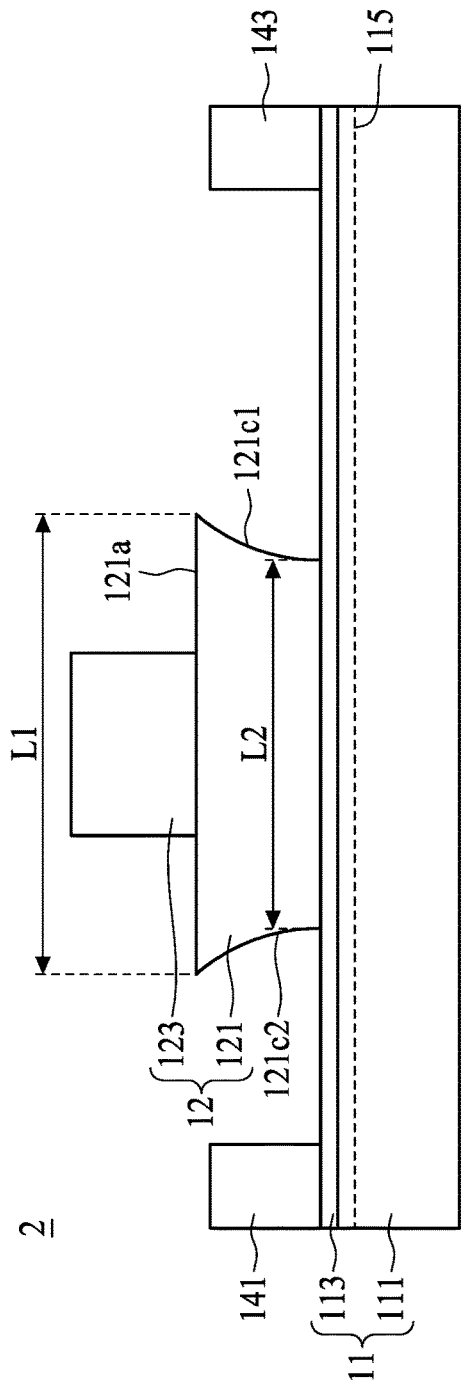
FIG. 2 is a cross-sectional view of a semiconductor device according to some embodiments of the present disclosure.

FIG. 2 is a cross-sectional view of a semiconductor device 2 according to some embodiments of the present disclosure. The semiconductor device 2 has a structure similar to the semiconductor device 1 shown in FIG. 1 except that, for example, the portion 121 of the gate structure 12 has a different structure.

As shown in FIG. 2, the portion 121 of the gate structure 12 tapers toward the III-V material layer 11. In some embodiments, the portion 121 of the gate structure 12 tapers from a cross-sectional view perspective.

In some embodiments, the portion 121 of the gate structure 12 has a curved surface (i.e., the surface 121c1 or the surface 121c2) extending between the surface 121a and the surface 121b. In some embodiments, the surface 121c1 or the surface 121c2 is concave towards the inside of the portion 121 of the gate structure 12. In some embodiments, the portion 121 of the gate structure 12 has two curved surfaces (i.e., the surface 121c1 and the surface 121c2) extending between the surface 121a and the surface 121b. In some embodiments, the surface 121c1 and the surface 121c2 are both concave towards the inside of the portion 121 of the gate structure 12. In some embodiments, the surface 121c1 and the surface 121c2 are concave towards different directions. In some embodiments, the curvature of the surface 121c1 and the curvature of the surface 121c2 may be the same or different.

Figure 3:
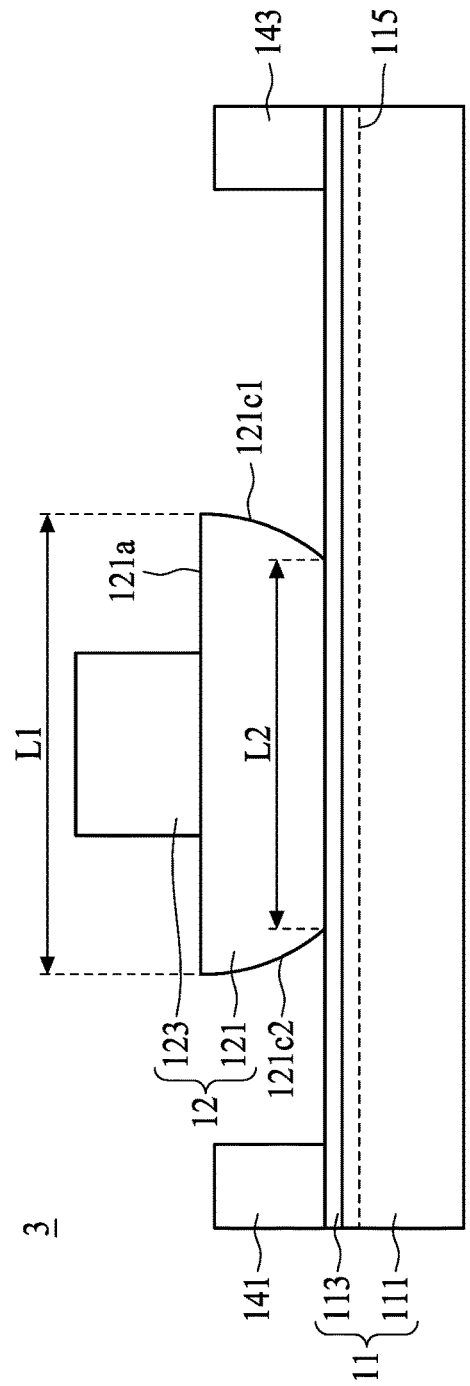
FIG. 3 is a cross-sectional view of a semiconductor device according to some embodiments of the present disclosure.

FIG. 3 is a cross-sectional view of a semiconductor device 3 according to some embodiments of the present disclosure. The semiconductor device 3 has a structure similar to the semiconductor device 1 shown in FIG. 1 except that, for example, the portion 121 of the gate structure 12 has a different structure.

As shown in FIG. 3, the portion 121 of the gate structure 12 has a curved surface (i.e., the surface 121c1 or the surface 121c2) extending between the surface 121a and the surface 121b. In some embodiments, the surface 121c1 or the surface 121c2 is convex towards a direction away from the portion 121 of the gate structure 12. In some embodiments, the portion 121 of the gate structure 12 has two curved surfaces (i.e., the surface 121c1 and the surface 121c2) extending between the surface 121a and the surface 121b. In some embodiments, the surface 121c1 and the surface 121c2 are convex towards directions away from the portion 121 of the gate structure 12. In some embodiments, the surface 121c1 and the surface 121c2 are convex towards different directions. In some embodiments, the curvature of the surface 121c1 and the curvature of the surface 121c2 may be the same or different.

Figure 4:
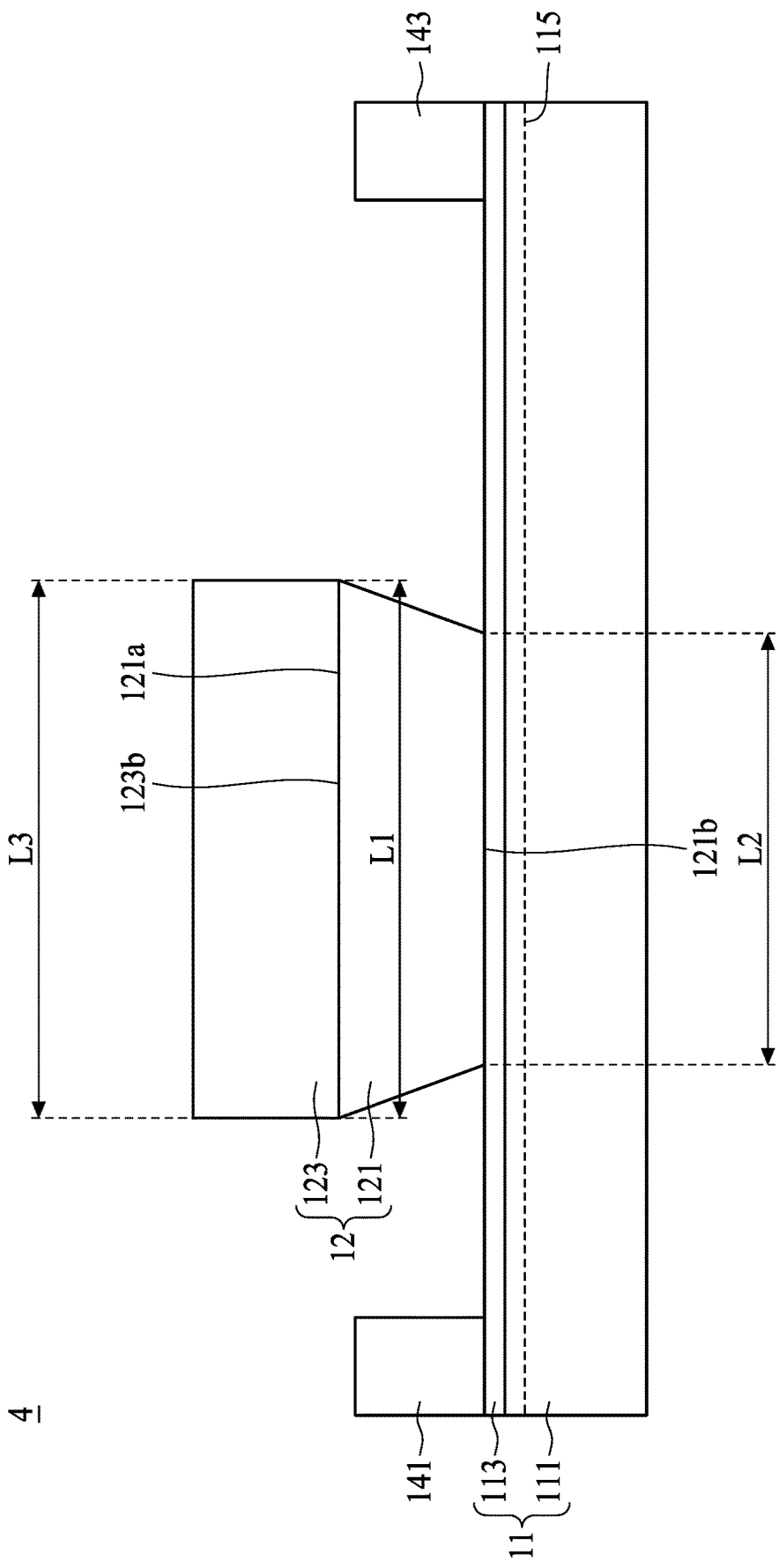
FIG. 4 is a cross-sectional view of a semiconductor device according to some embodiments of the present disclosure.

FIG. 4 is a cross-sectional view of a semiconductor device 4 according to some embodiments of the present disclosure. The semiconductor device 4 has a structure similar to the semiconductor device 1 shown in FIG. 1 except that, for example, the portion 121 of the gate structure 12 has a different structure.

As shown in FIG. 4, in some embodiments, the portion 123 of the gate structure 12 is in direct contact with the portion 121 of the gate structure 12, and the length L3 of the surface 123b of the portion 123 of the gate structure 12 is substantially the same as the length L1 of the surface 121a of the portion 121 of the gate structure 12. In some embodiments, an edge of the surface 123b of the portion 123 of the gate structure 12 is substantially aligned with an edge of the surface 121a of the portion 121 of the gate structure 12. In some embodiments, outer edges of the surface 123b of the portion 123 of the gate structure 12 are substantially aligned with outer edges of the surface 121a of the portion 121 of the gate structure 12.

As shown in FIG. 4, in some embodiments, the length L3 of the surface 123b of the portion 123 of the gate structure 12 is greater than the length L2 of the surface 121b of the portion 121 of the gate structure 12. In some embodiments, a ratio of the length L3 of the surface 123b of the portion 123 of the gate structure 12 to the length L2 of the surface 121b of the portion 121 of the gate structure 12 ranges from about greater than 1 to about 1.6. In some embodiments, the ratio of the length L3 of the surface 123b of the portion 123 of the gate structure 12 to the length L2 of the surface 121b of the portion 121 of the gate structure 12 may further range from about 1.1 to about 1.4.

Figure 5A:
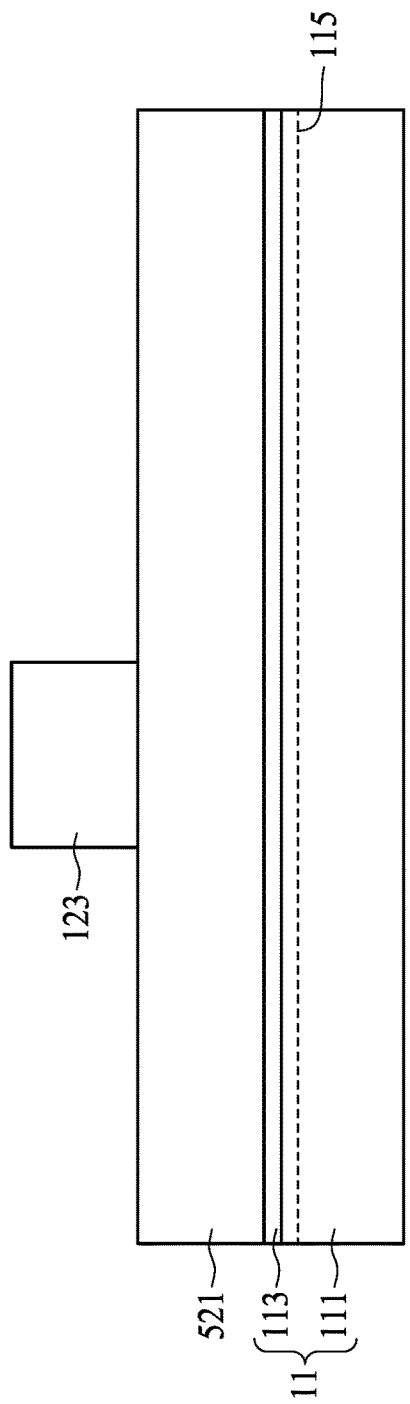
FIGS. 5A, 5B and 5C illustrate several operations in manufacturing a semiconductor device according to some embodiments of the present disclosure.
Figure 5B:
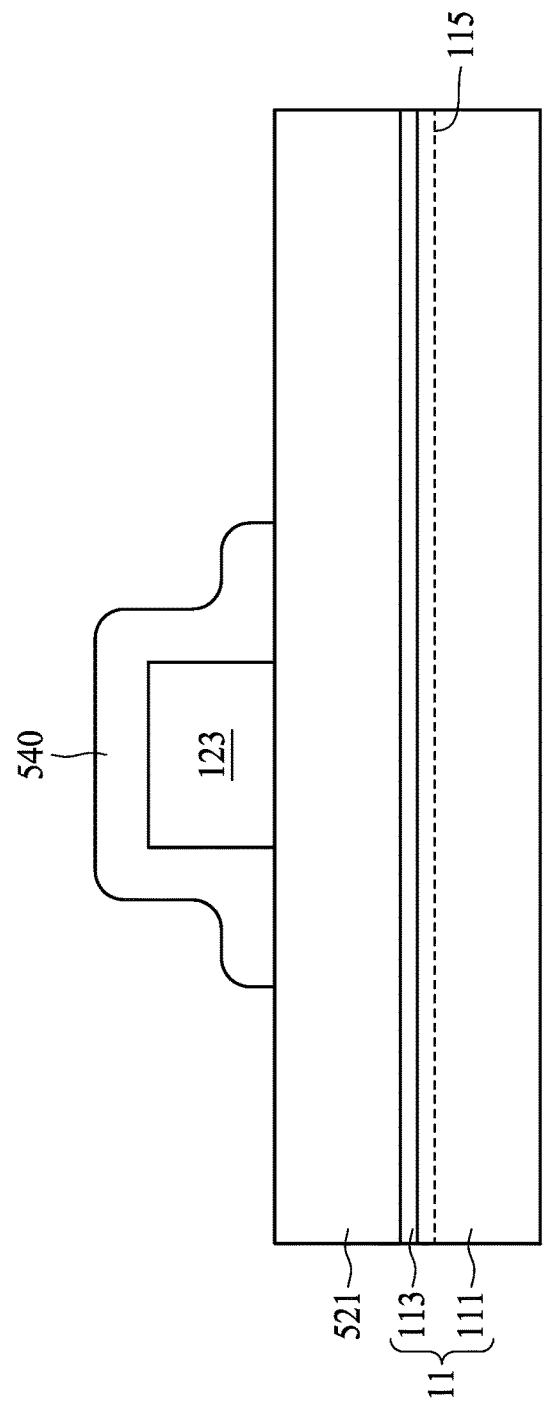
Figure 5C:
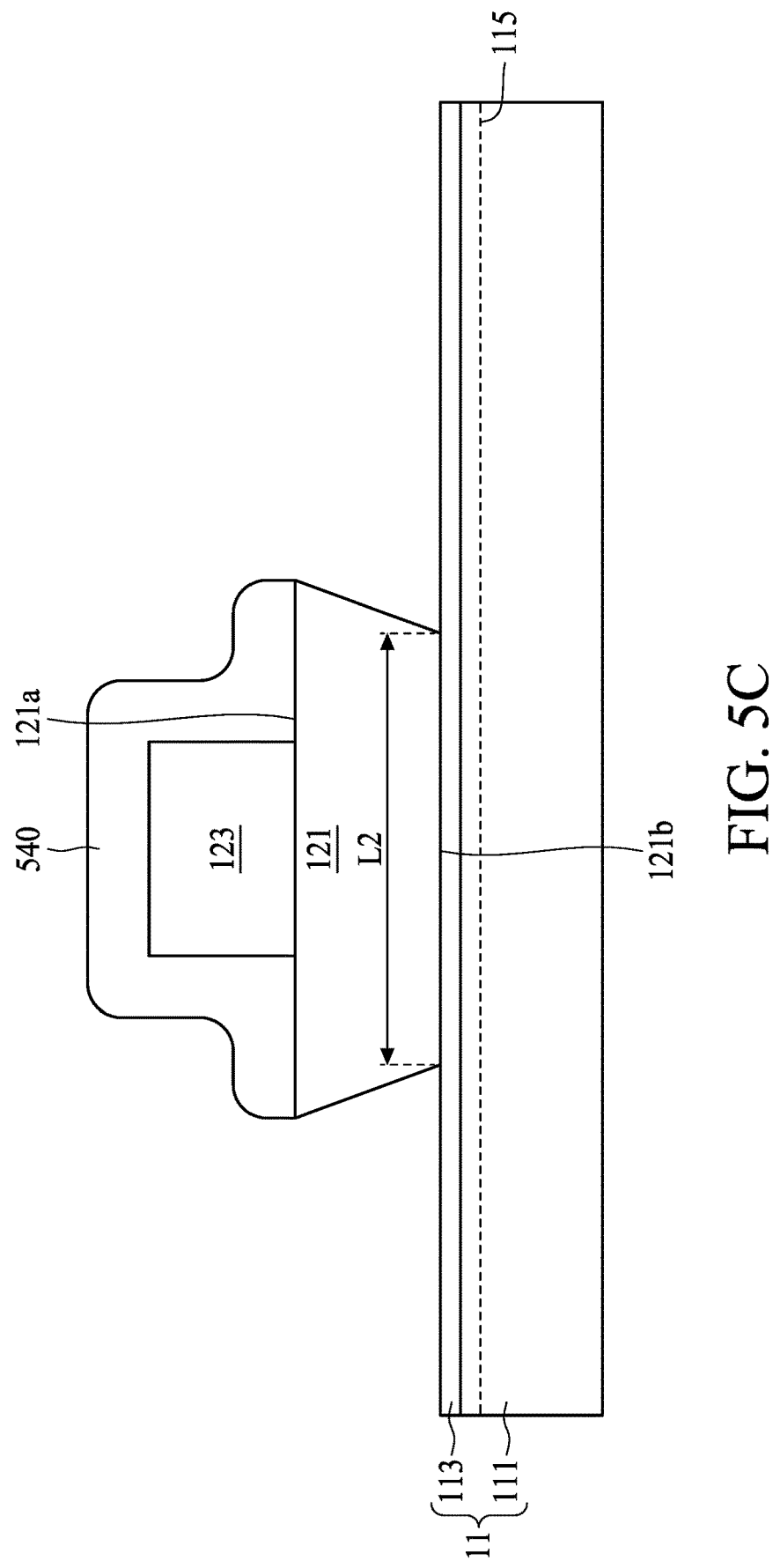

FIGS. 5A, 5B and 5C illustrate several operations in manufacturing a semiconductor device according to some embodiments of the present disclosure. Although 5A, 5B and 5C depict several operations for fabricating the semiconductor device 1, similar operations can also be used to fabricate the semiconductor device 2, 3 or 4.

Referring to FIG. 5A, a III-V material layer 11 including a III-nitride layer 111 and a III-nitride layer 113 is formed. In some embodiments, the III-nitride layer 111 is formed on a substrate (not shown in drawings), and the III-nitride layer 113 is formed on and in direct contact with the III-nitride layer 113. In some embodiments, the III-nitride layers 111 and 113 are formed by epitaxial growth. As a heterojunction is formed between the III-nitride layer 111 and the III-nitride layer 113, e.g., at an interface of the III-nitride layer 111 and the III-nitride layer 113, a 2DEG region 115 is formed adjacent to the interface of the III-nitride layer 111 and the III-nitride layer 113.

Next, still referring to FIG. 5A, a layer of first material 521 is formed on the III-V material layer 11. In some embodiments, the layer of first material 521 is formed by epitaxy technique. In some embodiments, the layer of first material 521 may be or include a group III-V layer. In some embodiments, the layer of first material 521 may be or include an epitaxial p-type III-V material. The layer of first material 521 may include, for example, but is not limited to, group III nitride, for example, a compound $Al_yGa_{(1-y)}N$, in which y≤1. In some embodiments, the layer of first material 521 may be or include a p-type doped group III-V layer. In some embodiments, the layer of first material 521 may include p-type doped GaN.

Next, still referring to FIG. 5A, a layer of second material is formed on the layer of first material 521, and a patterning process is performed on the layer of second material to form a portion 123 of a gate structure 12. In some embodiments, the layer of second material is formed by sputtering technique. In some embodiments, the layer of second material may be or include a gate metal. In some embodiments, the gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

In some embodiments, the patterning process on the layer of second material is performed by disposing a patterned mask on the layer of second material, etching the layer of second material using the patterned mask as an etch mask to remove a part of the layer of second material, and removing the patterned mask, so as to form the portion 123 on the layer of first material 521.

Referring to FIG. 5B, a mask layer 540 may be disposed on the layer of first material 521. In some embodiments, the mask layer 540 fully covers the portion 123. In some embodiments, the mask layer 540 covers a portion of the layer of first material 521. In some embodiments, the mask layer 540 may be or include a photoresist material.

Referring to FIG. 5C, a part of the layer of first material 521 is removed to taper the layer of first material 521 toward the III-V material layer 11 so as to form a portion 121 of the gate structure 12. In some embodiments, the part of the layer of first material 521 is removed by a dry etch process using the mask layer 540 as an etch mask. In some embodiments, the mask layer 540 defines the surface 121a (also referred to as "the upper surface") of the portion 121 of the gate structure 12.

In some embodiments, removing the part of the layer of first material 521 may further include the following operations. In some embodiments, the layer of first material 521 may be etched by applying a halogen-containing gas and a hydrogen-containing gas. The halogen-containing gas and the hydrogen-containing gas may be referred to as etchant gases. In some embodiments, a ratio of a flow rate of the halogen-containing gas to a flow rate of the hydrogen-containing gas may range from about 10 to about 100. In some embodiments, the ratio of the flow rate of the halogen-containing gas to the flow rate of the hydrogen-containing gas may range from about 20 to about 80.

In some embodiments, the halogen-containing gas includes $Cl_2$, $SiCl_4$, $I_2$, $Br_2$, $BCl_3$, $SF_6$, or a combination thereof. In some embodiments, the hydrogen-containing gas includes $H_2$, $CH_4$, or a combination thereof.

In some other embodiments, removing the part of the layer of first material 521 may further include the following operations. In some embodiments, the layer of first material 521 may be etched by applying a halogen-containing gas and an inert gas. The halogen-containing gas may be referred to as an etchant gas, and the inert gas may be referred to as a carrier gas. In some embodiments, a flow rate of the halogen-containing gas may range from about 60 sccm to about 120 sccm, and a flow rate of the inert gas may range from about 10 sccm to about 40 sccm. In some embodiments, the flow rate of the halogen-containing gas may range from about 80 sccm to about 100 sccm, and the flow rate of the inert gas may range from about 20 sccm to about 30 sccm.

In some embodiments, the halogen-containing gas includes $Cl_2$, $SiCl_4$, $I_2$, $Br_2$, $BCl_3$, $SF_6$, or a combination thereof. In some embodiments, the inert gas includes argon, helium, or a combination thereof.

In some embodiments, the part of the layer of first material 521 may be removed by a plasma-enhanced dry etch process using the mask layer 540 as an etch mask.

In some embodiments, removing the part of the layer of first material 521 by a plasma-enhanced dry etch process may further include the following operations. In some embodiments, the layer of first material 521 may be etched by applying a halogen-containing gas with a flow rate from about 30 sccm to about 120 sccm and a plasma power from about 300 W to about 600 W. In some embodiments, the layer of first material 521 may be etched by applying a halogen-containing gas with a flow rate from about 60 sccm to about 90 sccm and a plasma power from about 360 W to about 540 W.

Next, referring to FIG. 1, the mask layer 540 is removed. In some embodiments, conductive layers 141 and 143 are formed over the III-nitride layer 113. As such, the semiconductor device 1 shown in FIG. 1 is formed.

Figure 6A:
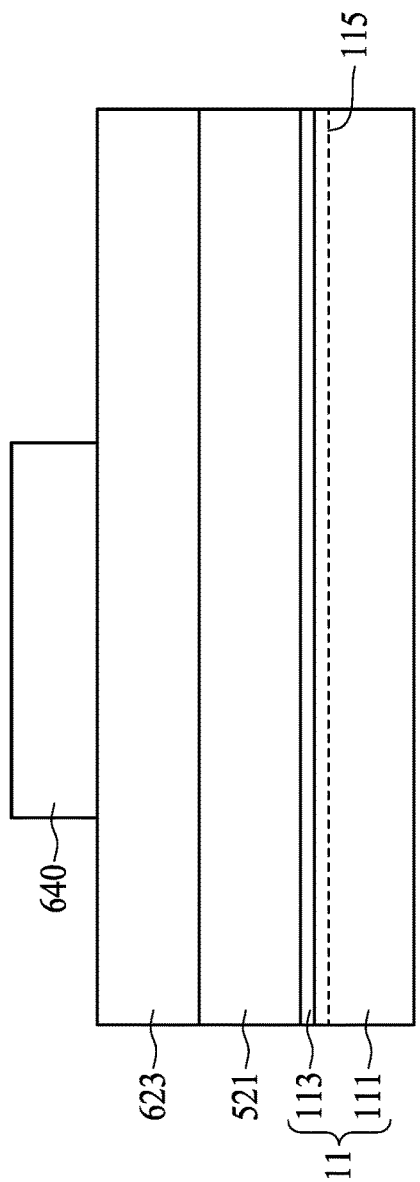
Figure 6B:
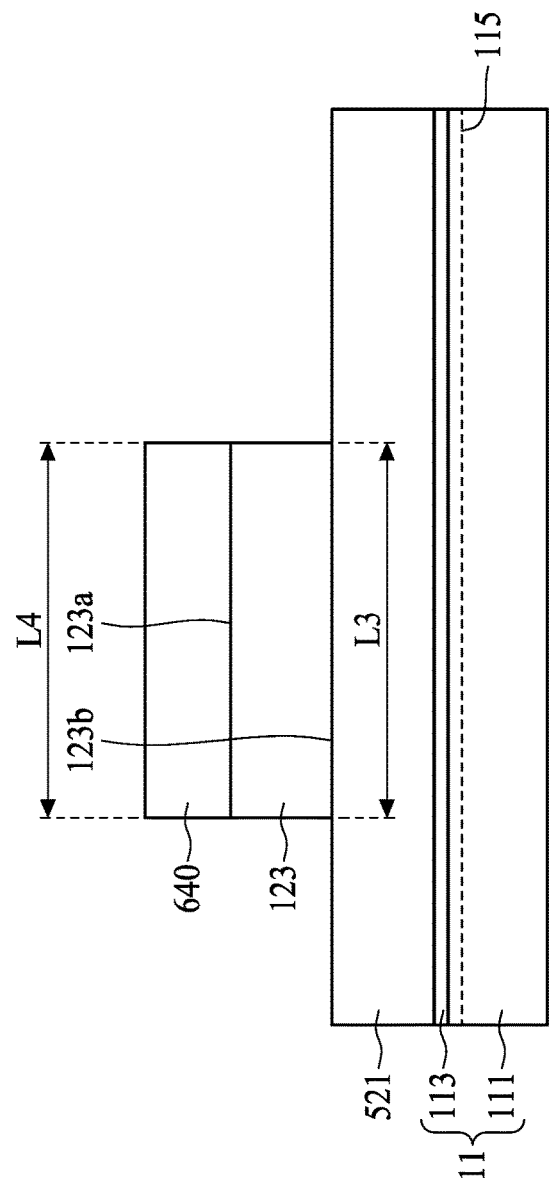

FIGS. 6A, 6B and 6C illustrate several operations in manufacturing a semiconductor device 4 according to some embodiments of the present disclosure. Although FIGS. 6A, 6B and 6C depict several operations for fabricating the semiconductor device 4, similar operations can also be used to fabricate the semiconductor device 1, 2 or 3.

Referring to FIG. 6A, a III-V material layer 11 including a III-nitride layer 111 and a III-nitride layer 113 is formed. Next, a layer of first material 521 is formed on the III-V material layer 11. In some embodiments, the layer of first material 521 is formed by epitaxy technique. In some embodiments, the layer of first material 521 may be or include a group III-V layer. In some embodiments, the layer of first material 521 may be or include an epitaxial p-type III-V material. The layer of first material 521 may include, for example, but is not limited to, group III nitride, for example, a compound $Al_yGa_{(1-y)}N$, in which y≤1. In some embodiments, the layer of first material 521 may be or include a p-type doped group III-V layer. In some embodiments, the layer of first material 521 may include p-type doped GaN.

Next, still referring FIG. 6A, a layer of second material 623 is formed on the layer of first material 521. In some embodiments, the layer of second material 623 is formed by sputtering technique. In some embodiments, the layer of second material 623 may be or include a gate metal. In some embodiments, the gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

Next, still referring to FIG. 6A, a mask layer 640 is disposed on the layer of second material 623. In some embodiments, the mask layer 640 covers a portion of the layer of second material 623. In some embodiments, the mask layer 640 may be or include a photoresist material.

Referring to FIG. 6B, a part of the layer of second material 623 is removed to form a portion 123 of the gate structure 12. In some embodiments, the part of the layer of second material 623 is removed by a dry etch process using the mask layer 640 as an etch mask. In some embodiments, the mask layer 640 defines a surface 123a (also referred to as "an upper surface") of the portion 123 of the gate structure 12. The as-formed portion 123 has a surface 123b (also referred to as "a bottom surface") opposite to the surface 123a. In some embodiments, a length L4 of the surface 123a of the portion 123 is substantially the same as the length L3 of a surface 123b of the portion 123.

The as-formed portion 123 further has surfaces 123c1 and 123c2 (also referred to as "lateral surfaces") extending between the surface 123a and the surface 123b. In some embodiments, the surface 123c1 and the surface 123c2 are substantially parallel. In some embodiments, the surface 123c1 and the surface 123c2 are substantially perpendicular to the surface 123a. In some other embodiments, the surface 123c1 and/or the surface 123c may be slanted with respect to the surface 123a.

Referring to FIG. 6C, a part of the layer of first material 521 is removed to taper the layer of first material 521 toward the III-V material layer 11 so as to form a portion 121 of the gate structure 12. In some embodiments, the part of the layer of first material 521 is removed by a dry etch process using the mask layer 640 and the portion 123 as an etch mask. In some embodiments, the portion 123 defines the surface 121a (also referred to as "the upper surface") of the portion 121 of the gate structure 12.

In some embodiments, removing the part of the layer of first material 521 may further include the following operations. In some embodiments, the layer of first material 521 may be etched by applying a halogen-containing gas and a hydrogen-containing gas. In some embodiments, a ratio of a flow rate of the halogen-containing gas to a flow rate of the hydrogen-containing gas may range from about 10 to about 100. In some embodiments, the ratio of the flow rate of the halogen-containing gas to the flow rate of the hydrogen-containing gas may range from about 20 to about 80.

In some embodiments, the halogen-containing gas includes $Cl_2$, $SiCl_4$, $I_2$, $Br_2$, $BCl_3$, $SF_6$, or a combination thereof. In some embodiments, the hydrogen-containing gas includes $H_2$, $CH_4$, or a combination thereof.

In some other embodiments, removing the part of the layer of first material 521 may further include the following operations. In some embodiments, the layer of first material 521 may be etched by applying a halogen-containing gas and an inert gas. In some embodiments, a flow rate of the halogen-containing gas may range from about 60 sccm to about 120 sccm, and a flow rate of the inert gas may range from about 10 sccm to about 40 sccm. In some embodiments, the flow rate of the halogen-containing gas may range from about 80 sccm to about 100 sccm, and the flow rate of the inert gas may range from about 20 sccm to about 30 sccm.

In some embodiments, the halogen-containing gas includes $Cl_2$, $SiCl_4$, $I_2$, $Br_2$, $BCl_3$, $SF_6$, or a combination thereof. In some embodiments, the inert gas includes argon, helium, or a combination thereof.

In some embodiments, the part of the layer of first material 521 may be removed by a plasma-enhanced dry etch process using the mask layer 640 and the portion 123 as an etch mask.

In some embodiments, removing the part of the layer of first material 521 by a plasma-enhanced dry etch process may further include the following operations. In some embodiments, the layer of first material 521 may be etched by applying a halogen-containing gas with a flow rate from about 30 sccm to about 120 sccm and a plasma power from about 300 W to about 600 W. In some embodiments, the layer of first material 521 may be etched by applying a halogen-containing gas with a flow rate from about 60 sccm to about 90 sccm and a plasma power from about 360 W to about 540 W.

Next, referring to FIG. 4, the mask layer 640 is removed. In some embodiments, conductive layers 141 and 143 are formed over the III-nitride layer 113. As such, the semiconductor device 4 shown in FIG. 4 is formed.

Figure 7:
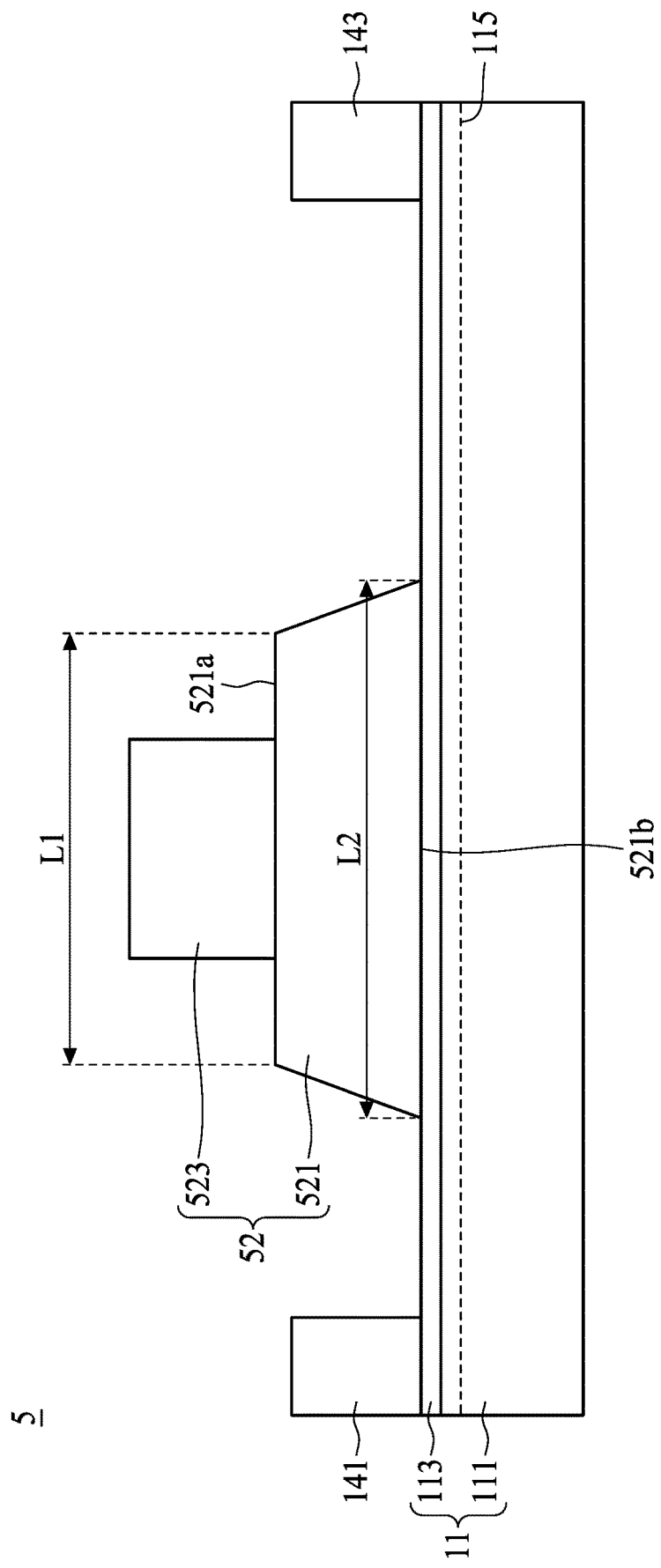
FIG. 7 is a cross-sectional view of a semiconductor device according to some embodiments of the present disclosure.

FIG. 7 is a cross-sectional view of a semiconductor device 5 according to some embodiments of the present disclosure. As shown in FIG. 7, the semiconductor device 5 includes a III-V material layer 11 and a gate structure 52. The gate structure 52 includes a portion 521 on the III-V material 11 and a portion 523 on the portion 521. The portion 521 may be or include a group III-V layer, and the portion 523 may be or include a metal gate. The portion 521 has a surface 521a (also referred to as "an upper surface") and a surface 521b (also referred to as "a bottom surface") opposite to the surface 521a. The portion 523 directly contacts the surface 521a of the portion 521. The surface 521b of the portion 521 directly contacts the III-V material layer 11.

In some embodiments as illustrated in FIG. 7, a length L2 of the surface 521b of the portion 521 of the gate structure 52 is greater than a length L1 of the surface 521a of the portion 521 of the gate structure 52. While edge portions of the surface 521b of the portion 521 exceed the outer edges of the surface 521a of the portion 521 and are relatively far from the portion 523 from a top view perspective, portions of the channel region underneath the portion 521 and corresponding to the edge portions of the surface 521b of the portion 521 may have relatively high conduction resistance.

Figure 8:
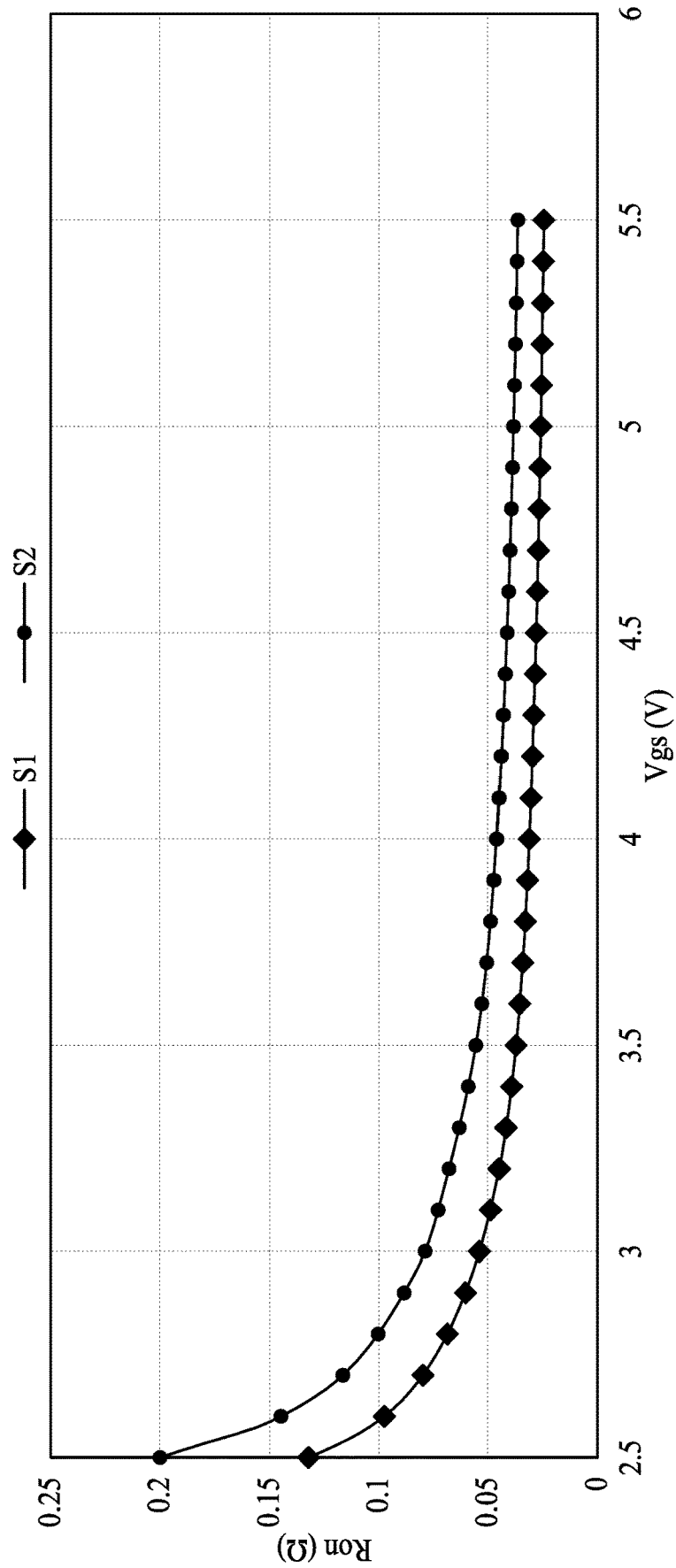
FIG. 8 shows curves of conduction resistance (Ron) vs. gate voltage (Vgs) according to some embodiments of the present disclosure.

FIG. 8 shows curves of conduction resistance (Ron) vs. gate voltage (Vgs) according to some embodiments of the present disclosure. In FIG. 8, the semiconductor device 1 shown in FIG. 1 and the semiconductor device 5 shown in FIG. 7 are adopted as examples; the curve S1 refers to the Ron-Vgs curve of the semiconductor device 1, and the curve S2 refers to the Ron-Vgs curve of the semiconductor device 5.

As shown in in FIG. 8, the curve S2 shows that the semiconductor device 5 having a bottom surface length (i.e., the length L2) longer than an upper surface length (i.e., the length L1) has a relatively higher conduction resistance. In contrast, the curve S1 shows that the semiconductor device 1 having a bottom surface length (i.e., the length L2) less than an upper surface length (i.e., the length L1) has a lower conduction resistance compared with that of the semiconductor device 5. According to the results shown in FIG. 8, with the design of the gate structure 12 according to some embodiments of the present disclosure, the channel region of the semiconductor device can have a relatively low conduction resistance, the metal gate (i.e., the portion 123 of the gate structure 12) can have a relatively good control ability over the channel region, and thus the electrical performance of the semiconductor device can be improved.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising:
a III-nitride semiconductor material layer; and
a gate structure comprising:
a first lower layer on the III-nitride semiconductor material layer, the first lower layer having a first upper surface facing directly away from the III-nitride semiconductor material layer and a second lower surface opposite to the first upper surface and adjacent to the III-nitride semiconductor material layer, wherein the first lower layer has opposite curved sidewalls extending entirely from the first upper surface of the first lower layer to the second lower surface of the first lower layer, and a horizontal distance from one sidewall of the curved sidewalls to another sidewall of the curved sidewalls which is opposite to the one sidewall is strictly increasing from the second lower surface of the first lower layer to the first upper surface of the first lower layer; and
a second upper layer on the first lower layer, wherein the second upper layer has a top surface and a bottom surface, and includes a gate metal;
wherein an entire length of the second lower surface of the first lower layer of the gate structure is less than an entire length of the first upper surface of the first lower layer of the gate structure, and wherein an entire length of the top surface of the second upper layer of the gate structure is less than or equal to the entire length of the first upper surface of the first lower layer of the gate structure.

2. The semiconductor device according to claim 1, wherein the first lower layer of the gate structure tapers from a cross-sectional view perspective.

3. The semiconductor device according to claim 2, wherein the first lower layer of the gate structure tapers toward the III-nitride semiconductor material layer and wherein the first lower layer includes a III-nitride semiconductor.

4. The semiconductor device according to claim 1, wherein an angle defined by the sidewalls with respect to the second lower surface of the first lower layer ranges from about 95° to about 145°.

5. The semiconductor device according to claim 1, wherein an angle defined by the sidewalls with respect to the second lower surface of the first lower layer ranges from about 110° to about 130°.

6. The semiconductor device according to claim 1, wherein an average surface roughness of the sidewalls is less than about 0.2 μm.

7. The semiconductor device according to claim 1, wherein the first upper surface of the first lower layer of the gate structure is substantially planar.

8. The semiconductor device according to claim 1, wherein the second upper layer of the gate structure is in direct contact with the first lower layer of the gate structure.

9. The semiconductor device according to claim 1, wherein the III-nitride semiconductor material layer is in direct contact with the second lower surface of the first lower layer of the gate structure.

10. The semiconductor device according to claim 1, wherein the second upper layer of the gate structure is in direct contact with the first upper surface of the first lower layer of the gate structure.

11. The semiconductor device according to claim 1, wherein the sidewalls are both concave towards inside of the first lower layer.

12. The semiconductor device according to claim 1, wherein the sidewalls are convex towards directions away from the first lower layer.

13. The semiconductor device according to claim 1, wherein an entirety of the second upper layer is in a position higher than the curved sidewalls of the first lower layer.

14. The semiconductor device according to claim 1, wherein the first upper surface of the first lower layer extends substantially parallel to the III-nitride semiconductor material layer.

15. The semiconductor device according to claim 1, wherein the second upper layer has a side surface extending entirely from the top surface of the second upper layer to the bottom surface of the second upper layer, the side surface of the second upper layer being substantially perpendicular to the III-nitride semiconductor material layer.

* * * * *